United States Patent
Eriksson

[11] Patent Number: 6,138,489
[45] Date of Patent: Oct. 31, 2000

[54] METHOD OF MAKING A HEAT TRANSFER DEVICE

[75] Inventor: Gunno Eriksson, Hallstahammar, Sweden

[73] Assignee: AB Webra, Enkoping, Sweden

[21] Appl. No.: 09/379,472

[22] Filed: Aug. 23, 1999

Related U.S. Application Data

[63] Continuation-in-part of application No. PCT/SE98/00671, Apr. 14, 1998.

[30] Foreign Application Priority Data

May 13, 1997 [SE] Sweden .................................. 9701171

[51] Int. Cl.$^7$ .................................................. B21C 23/00
[52] U.S. Cl. ................................ 72/256; 72/302; 72/377; 29/890.03
[58] Field of Search .......................... 72/256, 260, 302, 72/377, 378; 29/890.03

[56] References Cited

U.S. PATENT DOCUMENTS

| | | | |
|---|---|---|---|
| 2,716,805 | 9/1955 | Reed | 72/256 |
| 3,866,286 | 2/1975 | Pasternak . | |
| 4,187,711 | 2/1980 | Lavochkin et al. | 72/256 |
| 4,447,842 | 5/1984 | Berg | 361/386 |
| 4,609,040 | 9/1986 | Moore | 165/80.3 |
| 4,770,242 | 9/1988 | Daikoku et al. | 165/185 |
| 4,794,985 | 1/1989 | Paulman et al. . | |
| 4,821,389 | 4/1989 | Nelson | 29/157.3 R |
| 4,967,473 | 11/1990 | Wessel | 72/256 |
| 4,970,579 | 11/1990 | Arldt et al. | 357/81 |
| 5,085,272 | 2/1992 | Venables, IV | 165/184 |
| 5,201,866 | 4/1993 | Mok | 165/80.3 |
| 5,272,599 | 12/1993 | Koenen | 361/710 |
| 5,519,938 | 5/1996 | Kojima et al. | 29/890.03 |
| 5,758,418 | 6/1998 | Chrysler et al. | 29/890.03 |
| 5,802,719 | 9/1998 | O'Farrell, Jr. et al. | 72/256 |
| 5,848,545 | 12/1998 | Michisaka | 72/253.1 |
| 5,894,882 | 4/1999 | Kikuchi et al. | 165/80.3 |
| 5,901,040 | 4/1999 | Cromwell et al. | 361/704 |

FOREIGN PATENT DOCUMENTS

| | | | |
|---|---|---|---|
| 4 131 332 | 3/1993 | Germany . | |
| 5-337536 | 12/1993 | Japan | 72/256 |

*Primary Examiner*—Ed Tolan
*Attorney, Agent, or Firm*—Thomas R. Vigil

[57] ABSTRACT

A method of producing a heat transfer device comprising a base (1) and a number of flanges (2) projecting from the base (1), the device being formed with the flanges in a first mutual relation in a first operation and the base being subjected to at least partial deformation in a second operation so that the flanges projecting from the deformed portion of the base are brought into a second mutual relation, the flanges being arranged at shorter mutual distances in the second relation than in the first relation.

13 Claims, 1 Drawing Sheet

METHOD OF MAKING A HEAT TRANSFER DEVICE

This application is a continuation of international application number PCT SE /98/00671 filed Apr. 14, 1998.

FIELD OF THE INVENTION AND PRIOR ART

The present Invention is related to a method of producing a heat transfer device comprising a base and a number of flanges projecting from the base.

The field of the invention comprises heat transfer devices within a plurality of application fields, as for example cooling of semiconductors.

Heat transfer devices are used for cooling or heating an object. These devices are preferably made of a material with a high heat conductivity. Such materials are for example gold, copper and aluminium as well as different alloys of the same. The design of the heat transfer device is important for the heat transfer ability of the device.

The device is formed with a base and a number of flanges projecting from the same according to prior art. The base and the flanges may be formed in a plurality of different ways depending on the desired magnitude of the heat transfer, the design of the object intended for being heat transferred, the available space and so on.

The heat transfer device is arranged with the side of the base opposite the flanges directed towards the object to be cooled. The heat transfer takes place when the flanges are subjected to a cooling medium in the form of for example air or water by that heat is conducted from the object through the device and to the cooling medium.

A way of measuring the cooling ability of different devices is to measure the temperature of the object intended for being cooled during operation or the load of the same at a certain cooling medium flow.

It is desirable to arrange the device with a large surface for discharging heat and receiving cold, respectively in order to achieve a high cooling ability of the device, the flanges thereby desirably being formed with a large height and small mutual distances. With height is hereby understood the distance from the end of the flange adjacent to the base, to the free end located opposite the base.

Aluminium and aluminium alloys are materials well suited for being used for heat transfer devices due to their high conductivity, good deformability and that they are relatively non-expensive. With aluminium is below also referred to aluminium alloys. The use of aluminium is only an example and should not be regarded restrictingly, but also other materials are useable. According to prior manufacturing techniques, aluminium is injection moulded or extruded through a tool at an enhanced temperature and solidifies to an intended design. A so-called aluminium profile is formed by the Injection moulding or extrusion. The aluminium profile may thereafter be cut into lengths desired for the use in question.

It is advantageous to form the flanges with a large height and with small distances between adjacent flanges for a good cooling ability of the device. The height of the flanges and the distance between adjacent flanges are according to previously known manufacturing methods limited by the tools used for the manufacturing. The tool, through which the material is injection moulded or extruded is formed with elongated elements corresponding to the gaps between the flanges in the manufactured profile. Said tool is subjected to high loads during manufacturing due to that material of a relatively high temperature is pressed through the same. The elongated elements may be deformed or broken if they have a too large height In relation to the width thereof.

SUMMARY OF THE INVENTION

The object of the present invention is to obtain a method of producing a heat transfer device eliminating the above mentioned disadvantages of manufacturing methods according to prior art.

The object is achieved by the inventive method by that the device is formed with the flanges in a first mutual relation in a first operation and that the base is subjected to the partial deformation in a second operation so that the flanges projecting from the deformed portion of the base are brought into a second mutual relation, the flanges being arranged at shorter mutual distances in the second relation than in the first relation. By deforming a portion of the base in the second operation, the flanges projecting from this portion may be brought into a position where they are arranged at shorter mutual distances than what is possible according to previously known manufacturing techniques.

According to a first embodiment of the invention, in the first operation, the device is produced so that the base portion to be deformed has a curved structure and the flanges projects from the convex surface of the portion. It is thereby possible to obtain a shorter distance between two adjacent flanges in said portion by straightening the base to a recti-linear structure or to a position somewhat in between the first structure and the recti-linear structure.

According to another embodiment, which is a further development of the previous embodiment, in the second operation, the flanges projecting from said portion are brought to be substantially mutually parallel, said portion with the projecting flanges forming a region with good heat conductivity. An effective utilisation of said heat transfer region is achieved by arranging the flanges with a substantially equal height.

According to a further preferred embodiment of the invention, in the first operation, the base is provided with members that during the second operation are effected in order to deform said portion of the base so that the flanges projecting from the deformed portion of the base are brought into the second mutual relation. The base may thereby be deformed by that second members formed correspondingly to the effect members are brought into engagement with the same and move the same so that said base portion is deformed in a desired way. An easy and effective straightening of said base portion is thereby achieved.

BRIEF DESCRIPTION OF THE DRAWINGS

With reference to the enclosed drawings, a more close description of preferred embodiment examples of the invention follows hereunder.

In the drawings.

DETAILED DESCRIPTION OF PREFERRED EMBODIMENTS OF THE INVENTION

Figure 1:
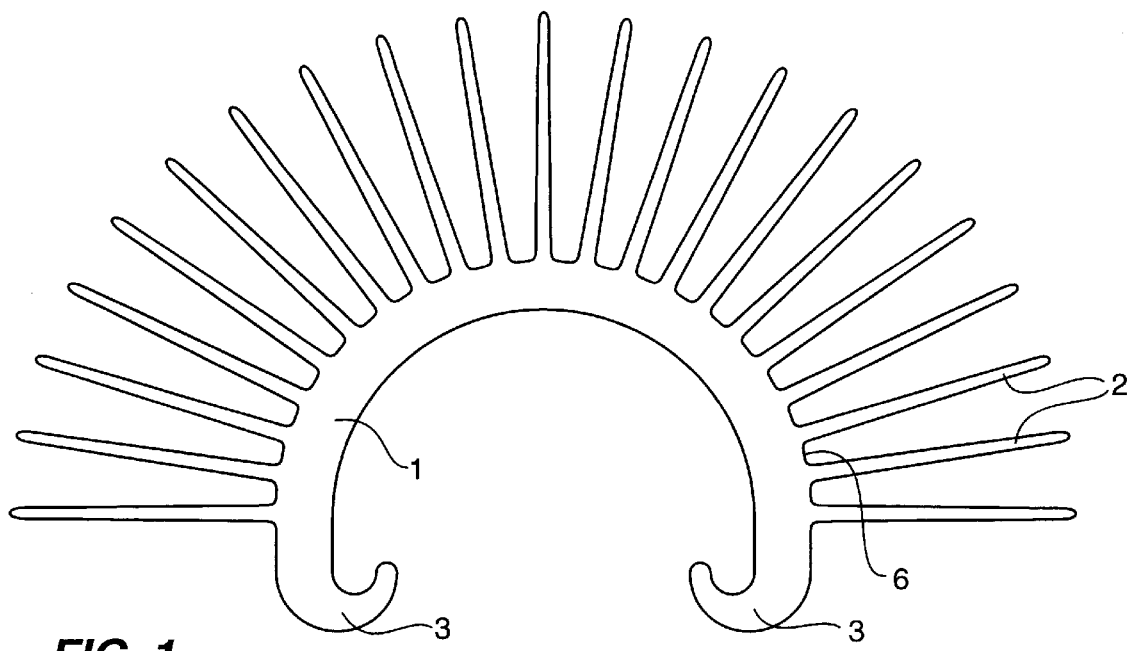
FIG. 1 is a side view of a first preferred embodiment of the device after the first operation.

A heat transfer device according to a first preferred embodiment is illustrated in FIG. 1 after a first operation of the inventive method. The device has a base 1 and a number of flanges 2 projecting from the base. The device also comprises effect members 3, which according to the first preferred embodiment of the invention are designed in the form of hooks. Said effect members 3 are preferably made in one single piece with the base 1 in the first operation. These members are provided for being effected in a second operation in order to deform the base so that the flanges 2 projecting from the deformed portion of the base 1 are brought into a mutual relation, in which they are arranged at mutually shorter distances than in the first relation.

The base 1 may within the scope of the inventive claims be designed in a plurality of different ways in order to provide an object with a desired heat transfer. The base 1 may for example desirably have a substantially recti-linear form with flanges 2 projecting substantially perpendicularly from the base 1 and the flanges being mutually parallel. The device may also have a more complicated design in order to achieve an optimum heat transfer for certain other objects. It may for example be desirable to achieve a device where the base has one or a plurality of curved portions and/or one or a plurality of recti-linear portions. The curved portions may also have different radiuses. It is according to the inventive method possible to form the device with the flanges in a first mutual relation in the first operation and to deform the base at least partially in a second operation so that the flanges projecting from the deformed portion of the base are brought into a second mutual relation, in which relation the flanges are arranged with mutually shorter distances than in the first relation. The base portion to be deformed may thereby be formed by substantially the whole base, which is the case according to the first preferred embodiment, with an exception for the effect members. Said portion of the base to be deformed may however also be made of one or a plurality of portions of a base, where the other portions are not subjected to deformation.

It may for example be desirable to achieve a larger cooling of a region of the object while there is not space enough to increase the dimensions of the flanges projecting from the portion of the base in said region. The inventive method is especially advantageous in such a case, the flanges in said portion being provided in a first mutual relation in a first operation and being brought to a second relation in a second operation, the flanges in said second relation being arranged with mutually shorter distances than in the first relation.

Figure 2:
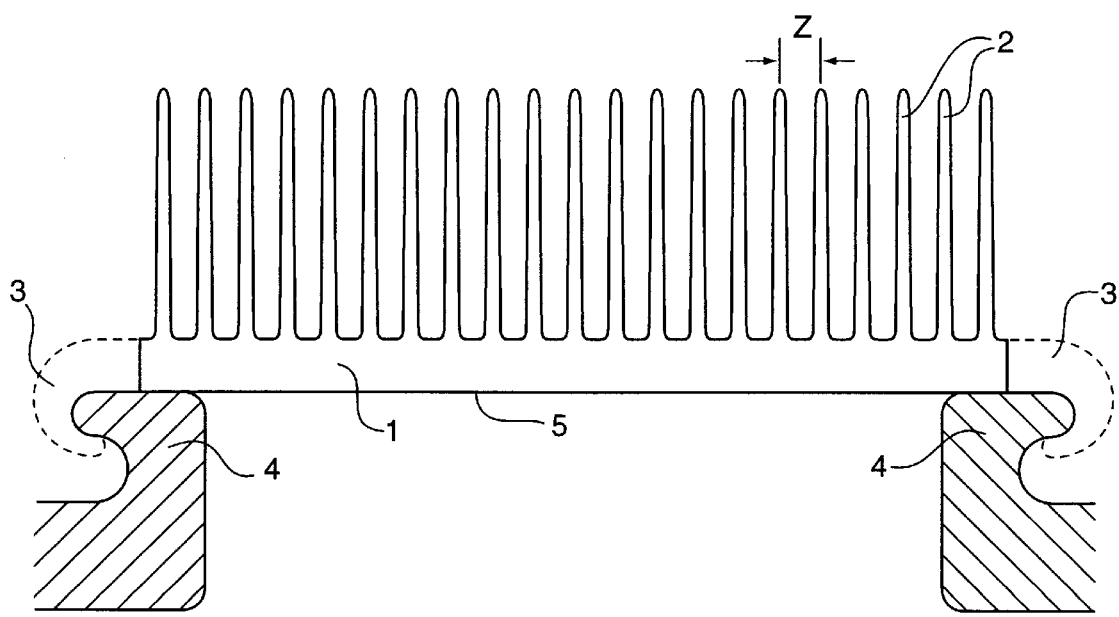
FIG. 2 is a side view, corresponding to FIG. 1, of the first preferred embodiment of the device after the second operation.

The inventive device is illustrated in FIG. 2 according to a first preferred embodiment after that the flanges have been brought into a second mutual relation in the second operation of the inventive method, said flanges being arranged with mutually shorter distances than in the first relation.

The device has a base 1 forming a substantially recti-linear structure in FIG. 2. The flanges 2 projecting from the base are substantially mutually parallel. Members 4 are illustrated in FIG. 2 for being brought into engagement with the effect members 3. These members 4 are illustrated in order to show how the deformation of the base 1 in the second operation changes the design of the device from the design illustrated in FIG. 1 to the design illustrated in FIG. 2. The extending deformation of the base 1 from having a substantially arced structure to a substantially recti-linear structure takes place by that the members 4 effect the members 3 with turning and/or pulling forces in different directions.

The effect members 3 are intended for being removed from the base after that the device is brought into the desired position. It is illustrated in FIG. 2 by the hatched contour lines of the effect members 3.

The object intended for being subjected to heat transfer by the inventive device is arranged by a surface 5 of the base 1 opposite the flanges 2.

The forming of the device in the first operation of the inventive method takes preferably place by that congealable material is supplied to a forming means in a flowing state or at least formable state. This forming means has for extrusion an opening running through the same, the material being forced through the opening and receiving a cross section form defined by the design of the opening. A so-called profile is formed by the extrusion, said profile having a constant cross section. Such an extrusion method may take place in the first operation of the production of the device. The device shown in FIG. 1 illustrates a side view of such a profile. The profile extends perpendicularly to the plane of the paper and by cutting the profile either before or after the second operation of the method, suitable lengths of the device may be achieved for the application in question It is also within the scope of the inventive claims to produce the device by supplying the material to a space interior of the forming means in the first operation, the design of said space defining the design of the device. The forming means is in this case a mould. More complicated forms of the device may in this way be achieved. The device is preferably made with the base 1 having a curved structure in the portion intended for deformation in the first operation and the flanges 2 project from the convex surface 6 of the portion. The portion is deformed in the second operation to a more extended structure in relation to the structure of the portion after the first operation and the inventive object that the flanges 2 projecting from said portion should be arranged with mutually shorter distances than after the first operation is thereby achieved.

Said curved structure of said portion of the base 1 may for example have an arced structure after the first operation.

In order to obtain the design of the device shown in FIG. 2, with a substantially recti-linear base 1 and the flanges 2 arranged substantially parallel and with a mutual distance shorter than what is possible for such a height of the flanges by previously known manufacturing techniques, and the flanges 2 extending substantially perpendicularly from the base, the device is preferably made in a first operation to having a form shown in FIG. 1, where the base has a substantially semi-circular structure and the flanges 2 extending substantially radially outwards from the base 1 and the flanges 2 being arranged with substantially equal mutual distances in the direction of the arc. The changing of the design of the device from the design shown in FIG. 1 to the design shown in FIG. 2 takes suitably place by the above mentioned turning/pulling method.

It is according to the inventive method also possible to achieve a heat transfer device with the flanges being arranged with different distances between adjacent flanges, said flanges projecting from different portions of the base. It is further possible to arrange flanges projecting from different portions of the base with different heights. It is further also possible to bring flanges projecting from different portions of the base to extend in different directions.

The material used for achieving said device is preferably aluminium or some aluminium alloy. It is however also possible to use plastics, ceramics, composites or some other metal alloy without leaving the scope of the inventive claims.

It should further be noted that the embodiments discussed above and illustrated in the drawings should only be regarded as examples. The invention may thus be realised in different ways without leaving the inventive idea. It is understood that men skilled in the art after having been presented to the inventive solution of course are capable of producing different formings of the exemplified embodiments without leaving the scope of the invention.

The described deformation of the base of the device may for example in the second operation of the method take place in a plurality of different ways. One or several cylinders may for example be brought into contact with the base on a surface of the same opposite the flanges. The base is deformed by rolling the cylinder on this surface and the flanges are thereby brought into a desired relation.

What is claimed is:

1. A method of producing a heat transfer device comprising a base (1) and a number of flanges (2) projecting outwardly from the base (1), wherein the flanges of the device are formed in a first mutual relation where inner ends of the flanges integral with the base are closer to each other than the outer ends and the base is formed in a curve with an inwardly extending hook at each end in a first operation and the base (1) is engaged by hook members of a pulling machine which engage the hooks at each end of the curved base and then pull the base into a straight line in a second operation so that the flanges projecting from the deformed portion of the base are brought into a second generally parallel relation, the flanges being arranged at shorter mutual distances in the second relation than in the first relation.

2. A method according to claim 1, characterized in that the device is formed by supplying congealable material in a flowing state or at least in a deformable state to a forming means in the first operation.

3. A method according to claim 2, characterized in that said material is brought through an inlet in the forming means and that the cross section of the device is defined by the design of the inlet.

4. A method according to claim 2, characterized in that the material is brought into a space arranged in the forming means, the design of said space defining the design of the device.

5. A method according to claim 1, characterized in that, in the first operation, the device is produced so that the base portion to be deformed has a curved structure and that the flanges (2) project from the convex surface (6) of the portion.

6. A method according to claim 5, characterized in that said portion of the base (1) forms an arced structure after the first operation.

7. A method according to claim 6, characterized in that said portion of the base (1) forms a semi-circular structure after the first operation.

8. A method according to claims 1, characterized in that said portion is deformed to a more elongated structure in the second operation in relation to the structure of the portion after the first operation.

9. A method according to claim 1, characterized in that, after the second operation, the deformed portion forms a substantially recti-linear structure.

10. A method according to claim 1, characterized in that the flanges (2) projecting from said portion after the first operation extend substantially radially outwards from the base (1).

11. A method according to claim 9, characterized in that, in the second operation, the flanges (2) projecting from said portion are brought to be substantially mutually parallel.

12. A method according to claim 1, characterized in that the device is formed by aluminium or some aluminium alloy.

13. The method of claim 1 including the subsequent step of cutting the hooks away from the base.

* * * * *